(12) United States Patent
Johnson et al.

(10) Patent No.: US 6,606,041 B1
(45) Date of Patent: Aug. 12, 2003

(54) PREDICTIVE TIMING CALIBRATION FOR MEMORY DEVICES

(75) Inventors: Brian Johnson, Boise, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/568,016

(22) Filed: May 10, 2000

(51) Int. Cl.[7] .............................. H03M 1/10; H03M 1/66
(52) U.S. Cl. ............................................ 341/120; 341/144
(58) Field of Search ................................. 341/118, 119, 341/120, 121, 144, 155

(56) References Cited

U.S. PATENT DOCUMENTS

| | | | |
|---|---|---|---|
| 4,755,951 A | * | 7/1988 | Hollister .................. 341/122 |
| 4,791,404 A | * | 12/1988 | Hollister .................. 341/122 |
| 5,266,952 A | * | 11/1993 | Stone et al. ............... 341/156 |
| 5,841,580 A | | 11/1998 | Farmwald et al. |
| 5,917,760 A | | 6/1999 | Millar |
| 5,953,263 A | | 9/1999 | Farmwald et al. |
| 6,016,282 A | | 1/2000 | Keeth |
| 6,035,365 A | | 3/2000 | Farmwald et al. |
| 6,038,195 A | | 3/2000 | Farmwald et al. |
| 6,041,419 A | | 3/2000 | Huang et al. |
| 6,067,592 A | | 5/2000 | Farmwald et al. |
| 6,101,152 A | | 8/2000 | Farmwald et al. |

FOREIGN PATENT DOCUMENTS

WO    WO 9946687    9/1999

OTHER PUBLICATIONS

Gillingham; "SLDRAM Architectural and Functional Overview"; SLDRAM Consortium, Aug. 29, 1997, pp. 1–14.

* cited by examiner

Primary Examiner—Peguy Jeanpierre
Assistant Examiner—Jean Bruner Jeanglaude
(74) Attorney, Agent, or Firm—Dickstein Shapiro Morin & Oshinsky LLP

(57) ABSTRACT

A unique way of using a $2^N$ bit synchronization pattern to obtain a faster and more reliable calibration of multiple data paths in a memory system is disclosed. If the $2^N$ bit synchronization pattern is generated with a known clock phase relationship, then the data-to-clock phase alignment can be determined using simple decode logic to predict the next m-bits from a just-detected m-bits. If the succeeding m-bit pattern does not match the predicted pattern, then the current data-to-clock alignment fails for a particular delay value adjustment in the data path undergoing alignment, and the delay in that data path is adjusted to a new value. All data alignment is ensured to occur to a desired edge of the clock signal, e.g., a positive going edge, by forcing a failure of all predicted m-bit patterns which are associated with an undesired edge, e.g., a negative going edge, of the clock signal.

117 Claims, 8 Drawing Sheets

PREDICTIVE TIMING CALIBRATION FOR MEMORY DEVICES

FIELD OF THE INVENTION

The present invention relates to an improved binary calibration technique which is useful for calibrating timing of control and data signals in high frequency DRAM memory devices which clock in data on positive and negative going edges of a clock signal.

DISCUSSION OF THE RELATED ART

Memory devices are constantly evolving in the directions of faster speed and higher memory density. To this end, dynamic random access memory (DRAM) devices have evolved from simple DRAM devices to EDO to SRAM to DDR SDRAM to SLDRAM, the latter of which is the subject of much current industry interest. SLDRAM has a high sustainable bandwidth, low latency, low power, user upgradability and support for large hierarchical memory applications. It also provides multiple independent banks, fast read/write bus turn-around, and the capability for small fully pipelined burst.

One characteristic of SLDRAM is that it uses both the positive-and negative-going edges of a clock cycle to READ and WRITE data to the memory cells and to receive command and FLAG data from a memory controller.

An overview of SLDRAM devices can be found in the specification entitled "SLDRAM Architectural and Functional Overview," by Gillingham, 1997 SLDRAM Consortium (Aug. 29, 1997), the disclosure of which is incorporated by reference herein.

Because of the required high speed operation of SLDRAM, and other contemporary memory devices, system timing and output signal drive level calibration at system initialization, such as at start-up or reset, is a very important aspect of the operation of such devices to compensate for wide variations in individual device parameters.

One of the several calibration procedures which is performed in current SLDRAM devices is a timing synchronization of clock signals CCLK (command clock signal) and DCLK (data clock signal) with data provided on incoming command paths CA and the FLAG path (for the CCLK signal) and on the data paths DQ (for the DCLK signal) so that incoming data is correctly sampled. Currently, a memory controller achieves this timing calibration at system initialization by sending continuous CCLK and DCLK transitions on those clock paths and transmitting inverted and non-inverted versions of a 15 bit repeating pseudo random SYNC sequence "111101011001000" on each of the data paths DQ, the command paths CA, and the FLAG path. The SLDRAM recognizes this pseudo random sequence by two consecutive ones "1" appearing on the FLAG bit and determines an optimal relative internal delay for CCLK and DCLK to optimally sample the known bit pattern. This optimal delay is achieved by adjusting the temporal position of the received data bits to achieve a desired bit alignment relative to the clock. This is accomplished by adjusting a delay in the receiving path of the received data until the received data is properly sampled by the clock and recognized internally. Once synchronization has been achieved, that is, the proper delays on the data receiving paths have been set, the memory controller stops sending the SYNC pattern and the SLDRAM, after all calibrations are completed, can be used for normal memory READ and WRITE access.

While the timing calibration described above, which is conducted at start-up and reset, has been found to perform adequately in most circumstances, there is a problem in that current SLDRAM devices capture incoming data on both positive and negative going transitions of the clock signals CCLK and DCLK. As a consequence, even when timing calibration is achieved it is not clear if alignment was achieved on a positive going or negative going clock edge. That is, the 15-bit synchronization pattern lacks any timing signature. It would be preferable to always align the data timing on one of the positive or negative going edges, e.g., the positive going edge, to simplify the command bit logic circuit. If circuit designers simplify the command bit logic circuit on the assumption that alignment is achieved on one of the positive and negative going edges, e.g., positive going edge, of the clock signal, achieving timing synchronization using the current 15 bit pseudo random pattern cannot guarantee that synchronization was achieved with respect to the correct, e.g., positive going, clock edge. If, for example, synchronization was achieved on the negative going edge of a clock signal when the circuitry is designed on the assumption that synchronization is achieved on a positive going edge, when data is later sampled during memory access the data sampling may be off by one bit. Moreover, because the 15-bit pseudo random pattern is repeated during the calibration process, there will be alternating times when it is properly synchronized on the correct clock transition, e.g., positive going, and then improperly synchronized with, e.g., a negative going transition, and there is no mechanism for knowing when the calibration process is completed, whether synchronization has been achieved in the positive or negative going transition of the clock. Thus, calibration may be achieved in the wrong phase, or edge, of the clock signal, leading to incorrect sampling of the data during memory access operations, or requiring additional complicated circuitry to ensure that incoming data is synchronized to the proper phase of the clock.

To overcome some of the shortcomings inherent in the 15 bit synchronization pattern, a $2^N$ bit synchronization pattern has been proposed in U.S. application Ser. No. 09/568,155, filed May 10, 2000. Because the $2^N$ bit synchronization pattern has an even number of bits, the calibration logic can achieve data synchronization on a desired phase of the associated clock. The synchronization pattern is preferably a $2^N$ bit pattern which is produced by adding an additional bit to a $2^N$-pseudo random bit pattern. The synchronization bit pattern employed is preferably 16 bits long.

While the $2^N$ bit synchronization pattern has advantages over the $2^N-1$ bit synchronization pattern, it still takes a certain amount of time to achieve synchronization, also termed calibration, of all incoming data paths. Moreover, even with a $2^N$ bit synchronization pattern, it is still possible that after all incoming data paths have been calibrated, there may still not be parallel alignment of the data bits across all incoming data paths, particularly if the range of possible timing compensation for the data paths is larger than a bit cycle. Still further, it is still possible to achieve synchronization on the undesired edge of the clock signal for some of the data paths.

SUMMARY OF THE INVENTION

The present invention utilizes the $2^N$ bit synchronization pattern described in U.S. application Ser. No. 09/568,155, filed May 10, 2000 in a unique way to obtain a faster and more reliable calibration of the data paths. Since an even number of clock cycles are used to clock in the $2^N$ bit synchronization pattern, the phase of the clock signal can be implied by the known order of the bits being captured. Typically, for a DDR/SLDRAM memory device the lowest common data burst rate is four (4) data bits. That is, four data bits at a time are serially sent on a data path. If the $2^N$ bit synchronization pattern is generated with a known clock phase relationship from a memory controller to a memory device, then the data-to-clock phase alignment can be determined using simple decode logic to predict the next four bits from a just-detected four bits. If the succeeding four bit pattern does not match the predicted pattern, then the current data-to-clock alignment fails for a particular delay value adjustment in the data path undergoing alignment, and the delay in that data path is adjusted to a new value.

This process repeats until the decode logic correctly predicts the next four bits indicating that the delay value currently set for the data path is correct. In actual practice, the invention uses this prediction scheme over all possible values of delay in a data path and develops a "window" of acceptable delay values which cause correct prediction of the next four bits of the synchronization pattern. Then, a delay value is set which is at or near the center of the window of acceptable delay values.

The invention also ensures that data alignment will occur to a desired edge of the clock signal, e.g., a positive going edge, by forcing a failure of all predicted four bit patterns which are associated with an undesired edge, e.g., a negative going edge, of the clock signal.

BRIEF DESCRIPTION OF THE DRAWINGS

The above and other advantages and features of the invention will be more clearly understood from the following detailed description of the invention which is provided in connection with the accompanying drawings in which.

DETAILED DESCRIPTION OF THE PREFERRED EMBODIMENTS

Figure 1:
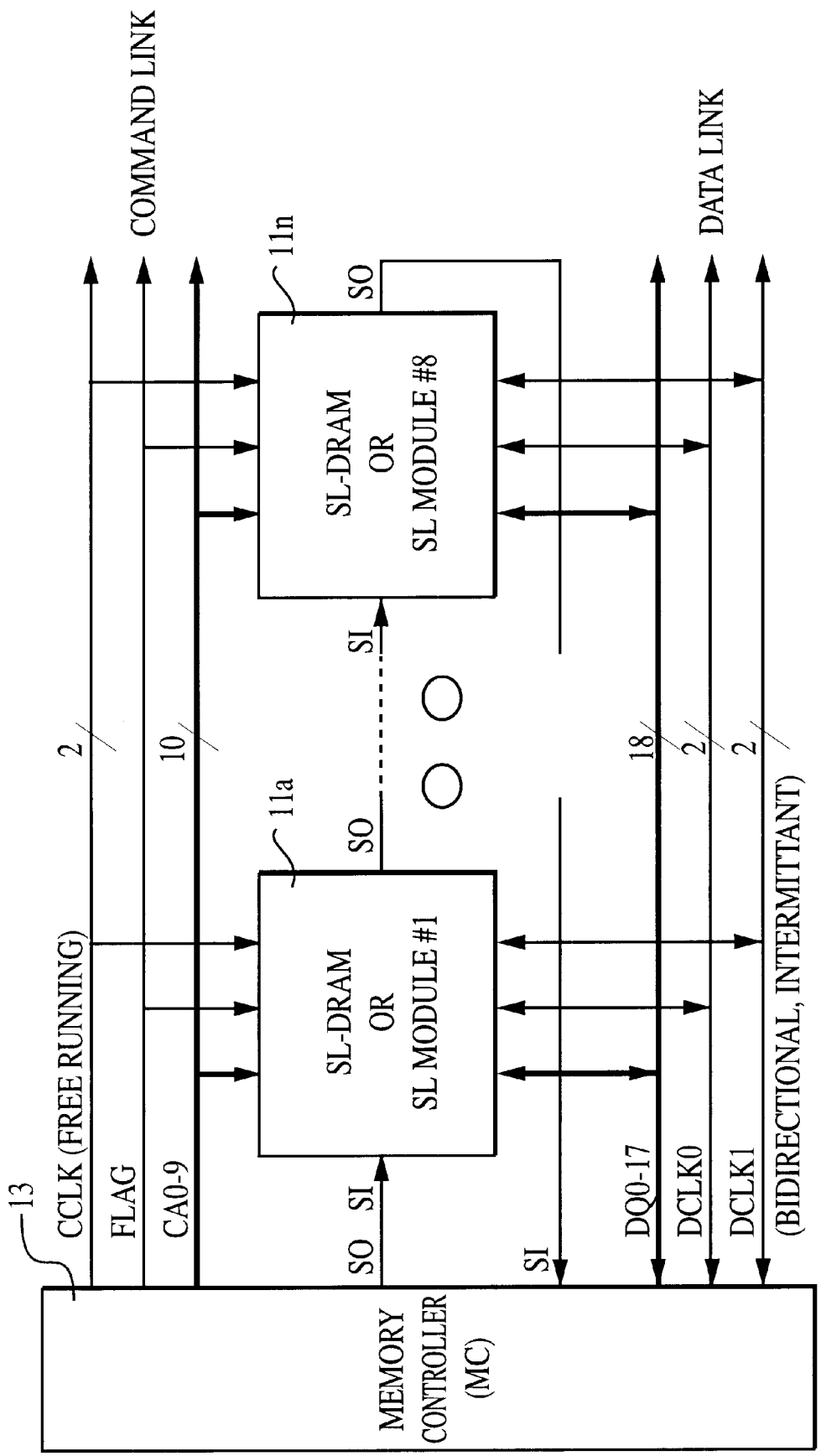
FIG. 1 illustrates an SLDRAM bus topology with which the invention may be used.

Exemplary embodiments of the invention will now be described with reference to an SLDRAM memory system. However, the invention has applicability to other types of memory systems as well. An exemplary SLDRAM system which may employ the invention is illustrated in FIG. 1. It includes a plurality of SLDRAM modules 11a. . . 11n which are accessed and controlled by a memory controller 13. Memory controller 13 provides a command link to each of the SLDRAM modules 11a. . . 11n which includes a clock signal CCLK on inverted and non-inverted clock signal paths, a 1 bit FLAG signal and a 10 bit command bus CA0-9. In addition, SLDRAM input/output signals S0, SI are provided from memory controller 13 in daisy chain fashion to the SLDRAM modules 11a. . . 11n. In addition, a bi-directional data bus DQO-17 is provided between memory controller 13 and each of the SLDRAM modules 11a. . . 11a. In, as are bi-directional data clocks DCLK0 and DCLK1. The clock DCLK0 is used to strobe input/output data into and out of the SLDRAM modules, a process for which the DCLK1 signal path is also intermittently used.

Figure 2:
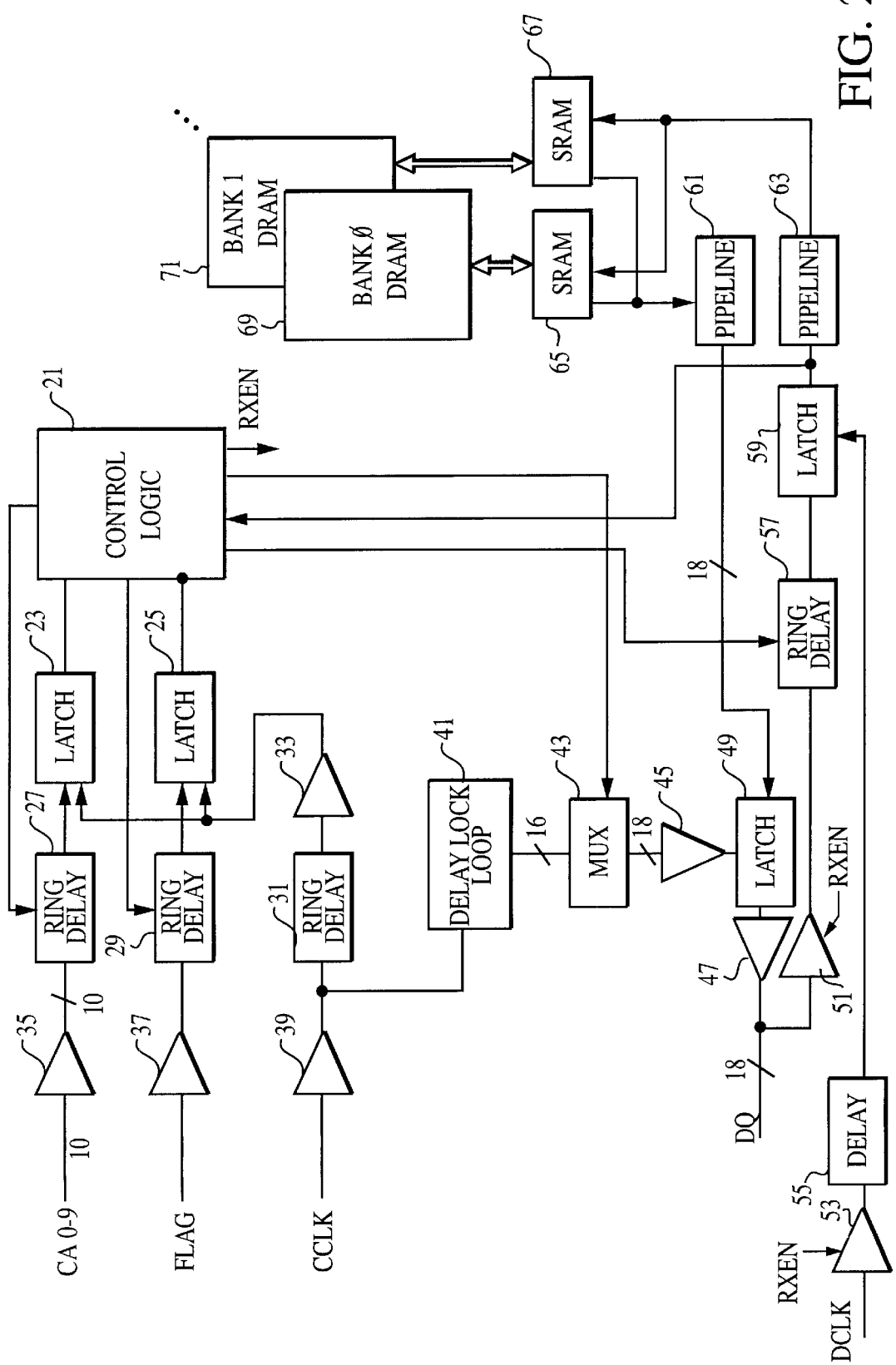
FIG. 2 illustrates a portion of the SLDRAM module shown in FIG. 1.

FIG. 2 illustrates a simplified relevant portion of one of the SLDRAM modules 11a. . . 11n. It includes a control logic circuit 21, latches 23, 25, 49, 59, delay devices 27, 29, 31, 55, 57 which may be ring delay devices, buffers 35, 37, 39, 33, 45, 47, 51, 53, a delay lock loop 41, multiplexer 43, pipeline circuits 61, 63, SRAM input/output circuits 65 and 67, and respective memory banks Bank0 and Bank1 69, 71. It should be noted that although two memory banks are illustrated in FIG. 2, this is just illustrative, as any number of memory banks can be used.

Control logic circuit 21 receives and analyzes commands on the CA0-9 bus and controls the input/output (I/O) access operations of the memory banks 69, 71. The control logic circuit 21 also receives the FLAG signal and the clock signal CCLK.

The signals on each of the command bus paths CA0-9 are passed through respective adjustable ring delay circuits 27 and into respective latches 23 where the signals are latched by a CCLK signal, as buffered by buffer 39, delayed by delay 31 and buffered by buffer 33.

The signal CCLK also passes from buffer 39 into a delay lock loop circuit 41 which provides 16 clock signals into a multiplexer 43. The multiplexer provides 18 clock output signals through respective buffers 45 to 18 latches 49 which latch data output from the memory banks 69, 71. The output data from memory banks 69, 71 pass into SRAMS 65, 67 which act as I/O buffers and pass through pipeline circuit 61 before being loaded into latches 49. The output data latched in latches 49 is provided to respective buffer amplifiers 47 and from there is passed back to memory controller 13 via data bus DQ.

Data which is to be input to memory banks 69, 71 is supplied by memory controller 13 on the DQ data bus, is passed through gated buffers 51 through ring delays 57 on each path of the data bus, into latches 59, through pipeline circuit 63. From pipeline circuit 63, input data on the DQ bus passes into buffer SRAM 65, 67 and into a memory bank 69, 71.

The control logic circuit 21 also issues an enable command RXEN whenever the memory controller indicates a memory access WRITE operation by way of a WRITE command in the data on the command bus CA0-9. The RXEN command enables the data input buffers 51 and a data clock input buffer 53. The data clock DCLK passes through gated buffer 53, delay circuit 55 and is used to control latch 59 to latch in incoming data on the data bus DQ.

In order to ensure proper timing of the various memory operations performed by the SLDRAM modules 11a. . . 11n, the FIG. 2 circuit must be synchronized to ensure the incoming data is properly timed relative to the clock signals CCLK and DCLK. To this end, a $2^N$ bit synchronizing pattern of the type described in U.S. application Ser. No.

09/568,155, filed May 10, 2000 is applied to each of the data input paths CAO-9 and FLAG while the data pattern is sampled in latches 23 and 25 by the delayed clock signal CCLK. One specific 16-bit synchronizing pattern described in that application is "1111010110010000."

Rather than trying to determine whether the entire 16 bit synchronization pattern is correctly received, the invention relies on predicting the next sequence of M-bits in the 16 bit synchronization pattern from a previous M-bit sequence. If the next bit sequence can reliably be correctly predicted one or more times, then the synchronization pattern is correctly received and calibration obtained. If the next M-bit sequence cannot be reliably correctly predicted one or more times, then the synchronization pattern has not been correctly received and calibration has not been attained, and a delay value in the data path under calibration is changed and synchronization is again attempted by predicting the next M-bit sequence from a prior M-bit sequence. This process repeats for all possible delay values with the control logic circuit tracking those delay values where data path calibration is achieved. The control logic circuit 21 then selects, as a final delay value, one which is at or near the center of those delay values which resulted in data path calibration.

The invention also ensures that synchronization is obtained on a desired one of the positive and negative going transitions of the clock, e.g., a positive going transition, by ensuring that the next M-bit sequence prediction of patterns associated with the undesired clock transition, e.g., a negative going transition, will be an incorrect prediction ("forced failure") and thus will always create a lack of calibration.

Figure 3:
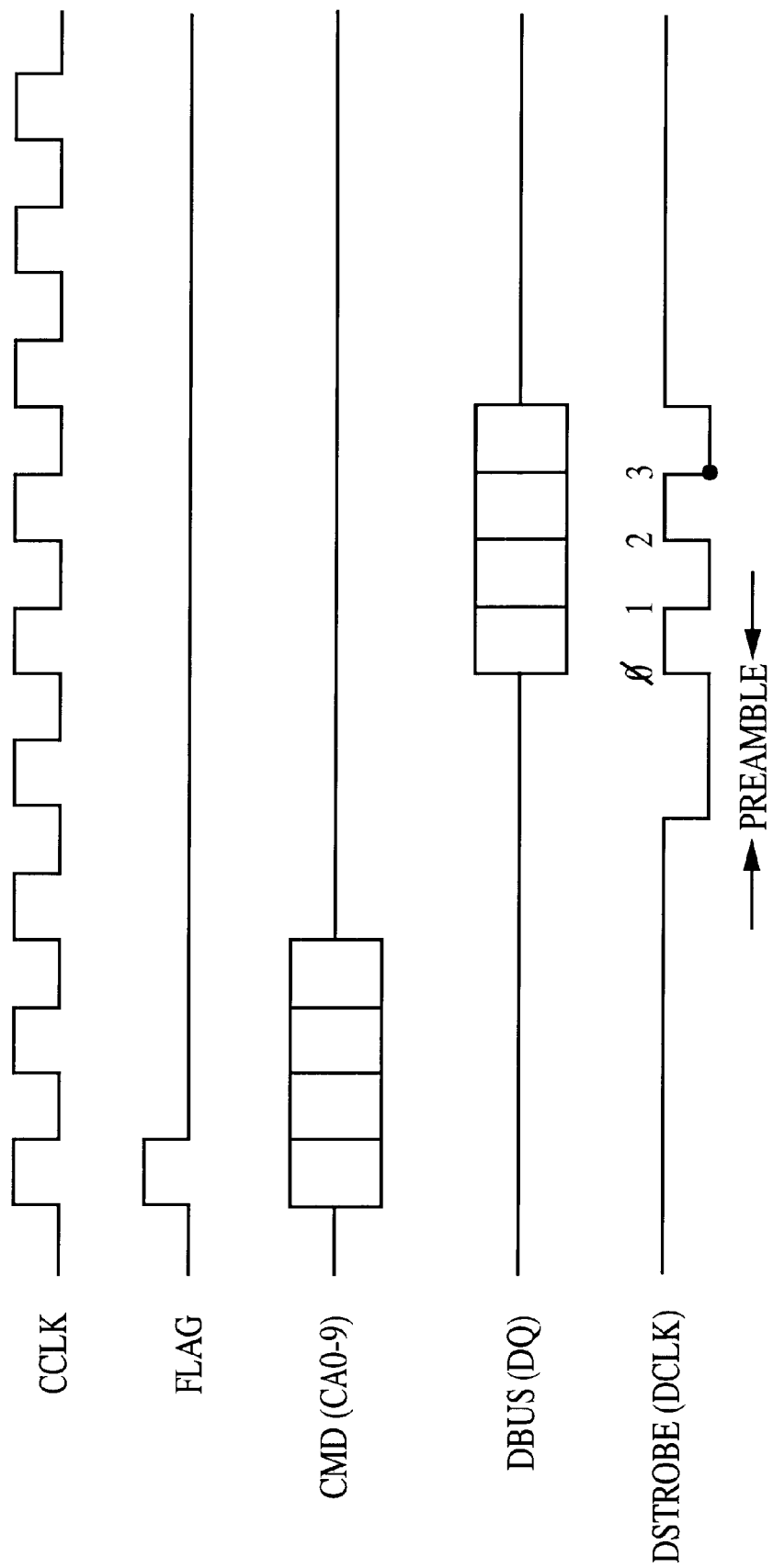
FIG. 3 illustrates a simplified timing diagram illustrating a portion of the timing signals used in the operation of the FIG. 2 circuit.
Figure 7:
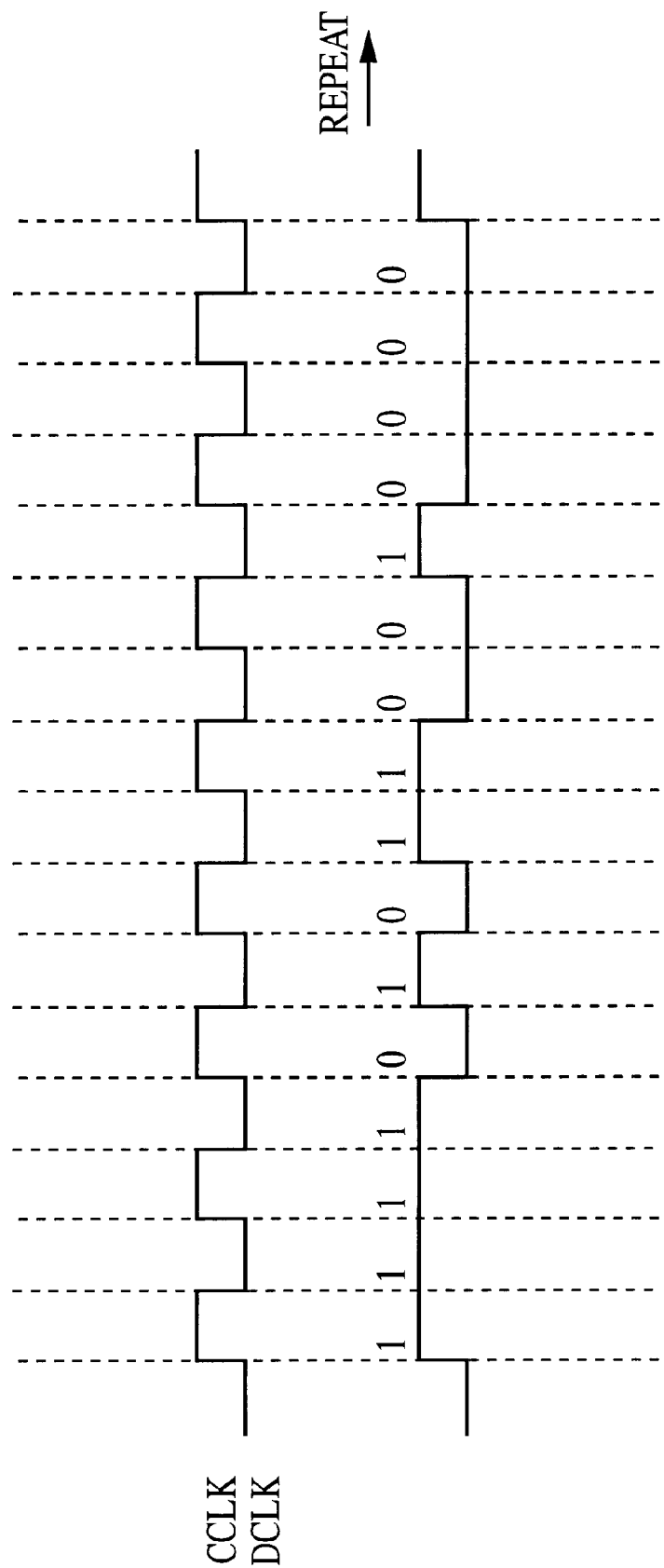
FIG. 7 illustrates a clock signal and associated $2^N$ 16-bit code used in the present invention.

To illustrate the calibration process, calibration of the data appearing on the FLAG path will now be described, it being understood that the same calibration process is also carried out on each path of the command bus CAO-9 and each receive path of the data bus DQ, although calibration of the DQ bus data paths is performed relative to the DCLK data strobe clock signal. FIG. 3 illustrates a simplified timing diagram of the clock signal CCLK, the FLAG signal, the command bus signal CA/CMD, a data bus signal DQ/DBUS and a data strobe signal DCLK. As shown, four bits (M=4) of data on a DQ path of the data bus (DBUS) are clocked in on four sequential positive and negative going transitions of the data clock signal DCLK after an initial PREAMBLE portion of DCLK appears. The data present on the command signal paths CAO-9 and on the FLAG path is clocked in in the same fashion by four sequential positive and negative going transitions of the command clock signal CCLK. The synchronization pattern "1111010110010000" and its relationship to the clock signal CCLK (and to DCLK) is illustrated in FIG. 7. These signals are sent from memory controller 13 to each memory module 11a . . . 11n.

Figure 8:
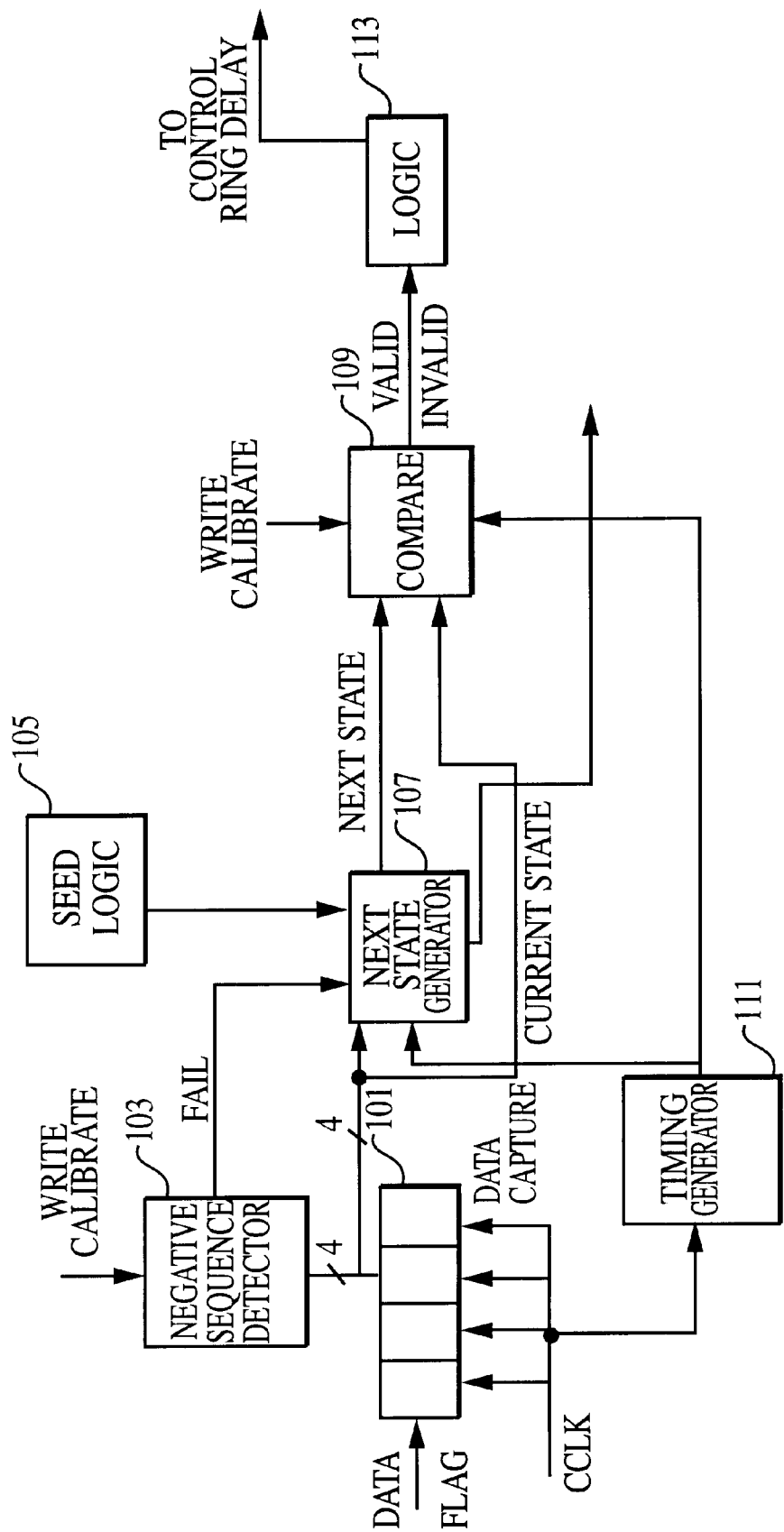
FIG. 8 illustrates a data capture and compare circuit used in the present invention.

Returning to FIG. 2, it can be seen that the data entering on the FLAG signal path passes through ring delay circuit 29 and is latched in latch 25 by the command clock signal CCLK. This data is then serially applied to control logic circuit 21. During the calibration period, the known $2^N$ bit synchronization pattern is applied to the FLAG path by memory controller 13 (FIG. 1), together with the free running clock signal CCLK (FIG. 7). The relevant portion of control logic circuit 21 for obtaining calibration is illustrated in FIG. 8 and will now be described.

The control logic circuit 21 includes a four bit data capture register 101, a negative sequence detector 103, a next state generator 107, a seed logic circuit 105, a comparator 109, a timing generator 111 and a logic circuit 113. Before describing the operation of the FIG. 8 circuit, the applied synchronization pattern and its relationship to the clock signal CCLK (or DCLK) is first discussed with reference to FIG. 7. As shown, the synchronization pattern is keyed to positive and negative going edges of the clock signal (CCLK or DCLK). Those four bit patterns which are initiated on positive going transitions of the clock signal and the immediately following next four bit patterns are shown in Table 1.

TABLE 1

| Current Four Bit Value | Next Four Bit Value |
| --- | --- |
| (1) 0000 | 1111 |
| (2) 1111 | 0101 |
| (3) 0101 | 1001 |
| (4) 1001 | 0000 |
| (5) 1101 | 0110 |
| (6) 0110 | 0100 |
| (7) 0100 | 0011 |
| (8) 0011 | 1101 |

Those four bit patterns which are initiated on negative going transitions of the clock signal and the immediately following next four bit pattern is shown in the following Table 2.

TABLE 2

| Current Four Bit Value | Next Four Bit Value |
| --- | --- |
| (1) 1110 | 1011 |
| (2) 1011 | 0010 |
| (3) 0010 | 0001 |
| (4) 0001 | 1110 |
| (5) 1010 | 1100 |
| (6) 1100 | 1000 |
| (7) 1000 | 0111 |
| (8) 0111 | 1010 |

One aspect of the present invention is to achieve calibration of a data path by comparing an M-bit sequence which is predicted from an immediately prior M-bit sequence with the next arriving M-bit sequence. To perform this comparison, multiple M-bit sequences appearing on a data path are compared with predicted M-bit sequences generated from the immediately preceding M-bit sequence. If the predicted M-bit sequence matches the next arriving M-bit sequence, then calibration has been achieved for the data path under calibration. If the predicted M-bit sequence does not match the next arriving M-bit sequence, then calibration has not been achieved and the control logic circuit 21 alters a delay value in the data path undergoing calibration and again looks for a match between the predicted and next arriving M-bit sequence. To achieve more reliable operation, calibration is indicated when this prediction and comparison process yields a match for several M-bit sequences appearing on the data path. That is, when repeated comparisons yield a match, the present delay value is found to produce calibration.

In a preferred embodiment, the control logic circuit 21 will actually step through all possible delay values for the data path under calibration, noting those delay values which produce calibration and then select as a final delay value for the data path that delay value which is at or near the center of those delay values which produced calibration.

Another aspect of the invention is ensuring that calibration occurs on a predetermined one of the positive and negative going transitions, e.g., the positive going edge of the clock signal. This is achieved by generating valid predicted values for those M-bit sequences associated with the predetermined clock transition, e.g., the positive going transition, and generating invalid predicted values for those M-bit sequences associated with the other clock transition, e.g., the negative going transition. Since the clock transition to which calibration is not desired will always have an invalid predicted next sequence, calibration to this clock edge will never be attained.

Returning to FIG. 8, one data path, e.g. FLAG, undergoing calibration is shown. It should be noted that the input data to the data capture register 101 is taken from input latch for the FLAG data path, i.e. latch 25 in FIG. 2. Also, in the example of the invention we assume that the arriving data comes in a four (4) bit burst (M=4), hence the four stages of the data capture register 101. Once a four bit sequence of the synchronization pattern is stored in register 101, negative sequence detector 103 examines the stored four bits to see if they correspond to a bit sequence which begins on an undesired transition of the clock signal to which the system should not calibrate. In the example given, we assume that calibration should be achieved on a positive going transition of the clock signal. Accordingly, if detector 103 recognizes a bit sequence that matches a value in the left column of Table 2, above, which is associated with a negative going clock transition, it sends a "FAIL" signal to next state generator 107. The next state generator 107 also receives the current bit sequence stored in register 101 and predicts from that bit sequence what the next four bit sequence should be.

Tables 1 and 2 show the 16 possibilities for the four bit sequence in register 101 and what the next predicted four bit sequence is for each. If the next state generator 107 does not receive a "FAIL" signal from detector 103, it will generate a correct predicted sequence. For example, if the current four bit sequence is "1111" (Table 1), the next state generator 107 will generate the "0101" pattern as the predicted next bit sequence. On the other hand, if the next state generator 107 receives a "FAIL" signal from detector 103, it will generate an incorrect predicted sequence. For example, if the current four bit sequence is "1011" (Table 2), the correct predicted next bit sequence should be "0010;" however, the "FAIL" signal causes generator 107 to generate a four bit pattern other than "0010," thus ensuring that calibration of the data path will not be achieved.

Figure 6:
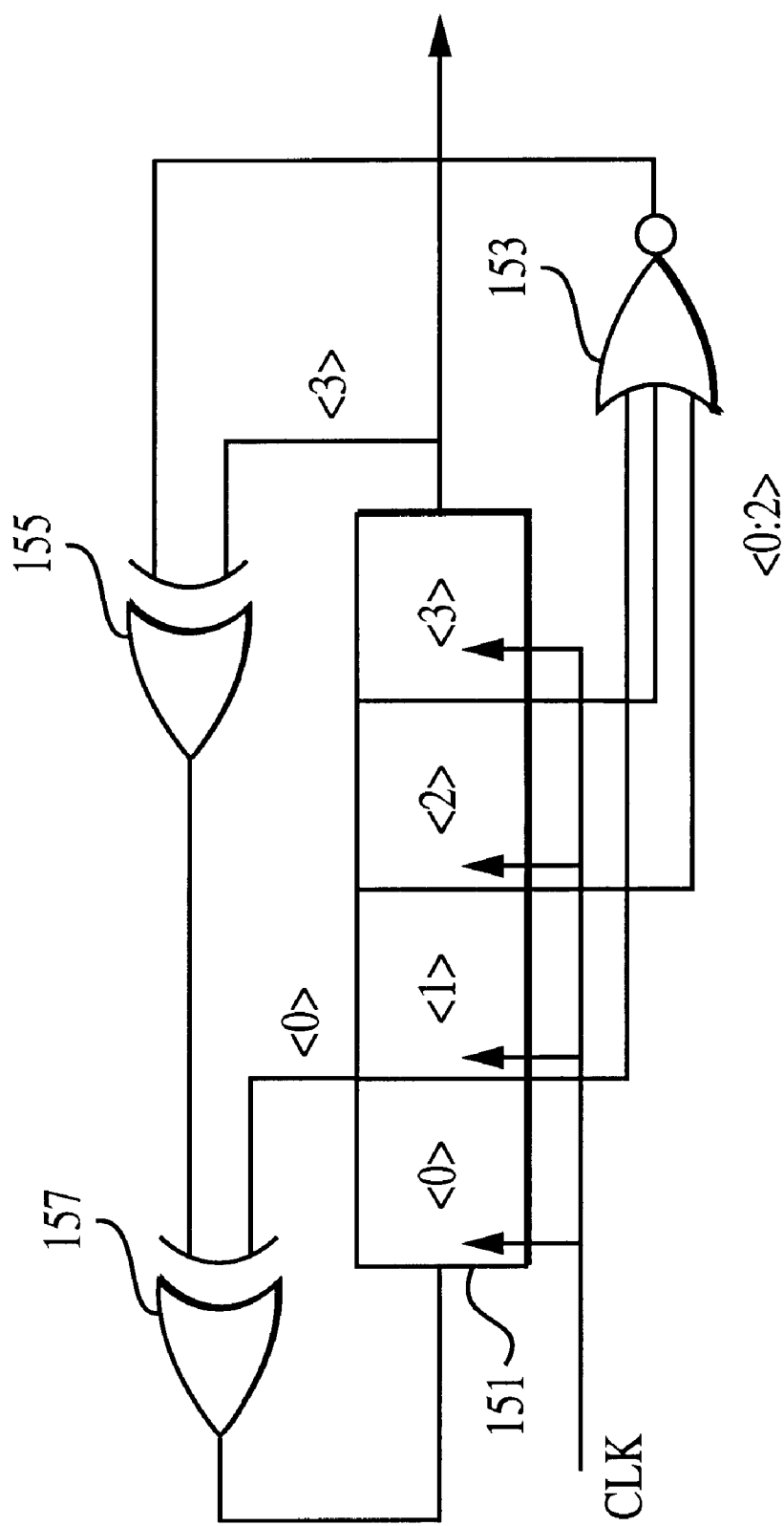
FIG. 6 is a representative circuit for generating a $2^N$ 16-bit code used in the present invention.

Next state generator 107 may be implemented as a four-bit shift register like that illustrated in FIG. 6. The 'seed' value received by the next state generator 107 from seed logic 105 causes its output to be the same repeating $2^N$ bit pattern, in M bit sequences, except that it is one M bit sequence ahead in phase than that appearing on the data path under calibration. For example, the seed logic 105 may seed next state generator 107 to produce an initial output of "0101," or the first M bit sequence after the initial sequence, "1111." Thereafter, next state generator 107, operating the same as the shift register generating the calibration pattern, will always be M bits ahead of the calibration pattern. The output of next state generator is transmitted to the compare circuit 109 as well as back to the memory controller 13 (FIG. 1). Transmission to the memory controller 13 is required for calibration of the controller 13.

Compare circuit 109 compares the predicted next bit sequence, received from generator 107, with a next arriving or now current four bit sequence in register 101. If coincidence of the compared data exists, this indicates that the arriving data on the data path being calibrated is properly timed with the correct edge of the clock signal. If coincidence does not exist, this indicates that such calibration has not been obtained. The comparison result is applied to a logic circuit 113 which, if data coincidence is present, notes the delay value for the ring delay, e.g. ring delay 29 for the FLAG data path, in the example given. As noted, in a preferred embodiment, the logic circuit 113 will actually control the ring delay such that it steps through all possible delay values with logic circuit 113 noting which of those delay values produced calibration of the data path. After all delay values have been stepped through, the logic circuit 113 will set as a final delay value for the ring delay, e.g. ring delay 29, the delay value which is at or near the middle of the range of delay values which produced signal path calibration.

FIG. 8 also shows a seed logic circuit 105 which is used to seed a pattern generator within the next state generator 107 so that the latter may produce the same synchronization pattern which is incoming on the data path under calibration. The detector 103 and compare circuit 109 also receive enabling "WRITE CALIBRATE" signals generated by control logic circuit 21 when data path calibration is required. Timing generator 111 receives the incoming clock signal (CCLK in the example shown) and properly times the operation of the generator 107 and compare circuit 109.

While an exemplary embodiment of the invention has been described with reference to calibrating to a positive going edge of the clock signal, it can also be calibrated to a negative going edge of the clock signal as well, in which case the patterns in the left hand column of Table 1 are detected by detector 103 to generate a "FAIL" signal, and thus used to generate invalid four bit patterns in generator 107, while the four-bit patterns in the left column of Table 2 are used for prediction of the next arriving four-bit pattern.

The four it patterns in the left column of Table 2 may also be used in another aspect of the invention, timing calibration of a memory controller 13 shown in FIG. 1. The following discussion assumes that a similar control logic circuit to that shown in FIG. 8 is included in the memory controller 13. However, this is not required and other methods of calibrating the memory controller are possible using the memory devices and method in accordance with the invention. In order to ensure the proper timing of memory operations performed by the SLDRAM modules 11a. . . 11n, the memory controller 13 must be calibrated so that signals, such as READ or WRITE data, are properly timed relative to the clock signals CCLK and DCLK. To this end, a $2^N$ bit synchronizing pattern of the type described in U.S. patent application Ser. No. 09/568,155, filed May 10, 2000 is generated at a memory device at next state generator 107 (FIG. 8) and applied to each of the data paths back to memory controller 13. As noted, one specific 16-bit synchronizing pattern described in that application is "1111010110010000."

Referring to FIG. 8, during calibration of the memory controller an M-bit sequence of the $2^N$ bit synchronizing pattern is generated at the next state generator 107 and transmitted back to the memory controller 13. The memory controller 13 may include a similar control logic circuit to that shown in FIG. 8 in order to adjust its corresponding ring delays to synchronize its own timing with the clock signals CCLK and DCLK for each of its corresponding command paths CAO-9, data paths DQO-17 and the FLAG path.

Figure 4:
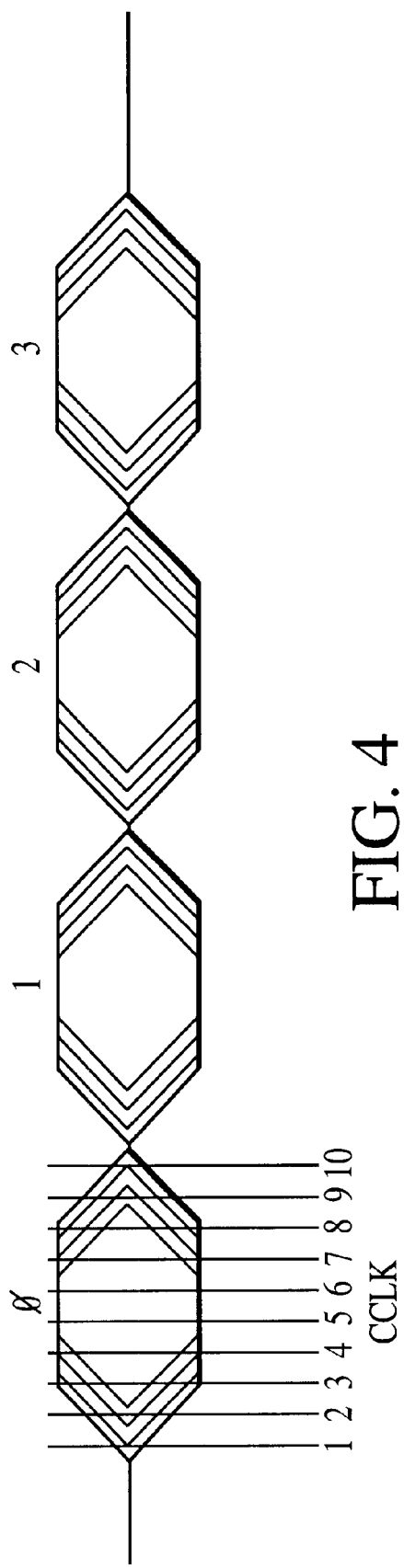
FIG. 4 illustrates a graphic example of the synchronization technique used to synchronize the SLDRAM system of FIG. 1.
Figure 5:
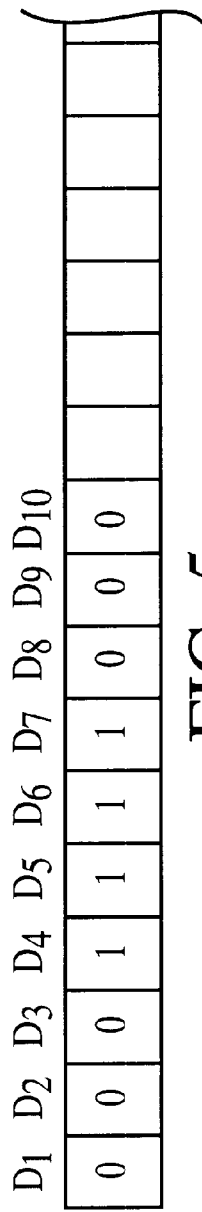
FIG. 5 illustrates a pattern of acceptable delay values for synchronization used in the invention.

FIG. 4 illustrates the data envelope for consecutive bits of the $2^N$ bit synchronization pattern together with the clock signals CCLK which latch the data in latch 25. The relative timing of the data envelope and the control data clock CCLK is illustrated as ten possibilities CCLK 1 . . . 10, that is, ten possible delay values for ring delay 29. The beginning and end of the data envelope is where the data on the FLAG path is unstable which can lead to erroneous sampling of the data. As shown, reliable data capture occurs at the relative timing location $C_4$ through $C_7$, while unreliable data capture occurs at the relative timing locations $C_1 \ldots C_3$ and $C_8 \ldots C_{10}$. These are represented within control logic circuit 21 as delay values $D_4 \ldots D_7$, where the predicted four bits of the synchronizing pattern matched the newly arriving four bits. FIG. 5 illustrates how this is represented in control logic circuit 21 where delay values $D_1 \ldots D_3$ and $D_8 \ldots D_{10}$ show a "0" logic state representing that the sequence matching was not recognized and the logic state "1" for delay values $D_4 \ldots D_7$, indicating a proper matching of the predicted and next-received four-bit sequences. It should be understood that although only 10 relative delay states of the data to the command clock signal CCLK are shown for simplicity, in actual practice there may be many more possible delay stages for ring delay 29 and the delay state pattern illustrated in FIG. 5.

Once the delay state pattern shown in FIG. 5 is developed by control logic circuit 21, it selects as a final delay for ring delay 29 a delay value which is approximately in the center of those delay values, e.g., $D_4 \ldots D_7$, which produced a match of the compared four bit sequences. In the example illustrated, the final delay would be selected as $D_5$ or $D_6$. Once this value is set for ring delay 29, the FLAG data path has been calibrated.

The same calibration procedure is also applied to each of the CMD data paths CA0-9 and to each of the data paths of the DQ bus, except for the latter, the data clock DCLK is used to latch the data in latch 59 which is present in each of the data paths of the DQ data bus, thus the data paths of the DQ data bus are aligned relative to the DCLK clock signal.

A circuit for generating and predicting a $2^N$ bit pattern, where N=4, to produce a repeating 16 bit pattern, is illustrated in FIG. 6. It includes a four stage shift register 151 having bit positions <0><1><2><3>, NOR gate 153 having three inputs respectively connected to the <0><1><2> outputs of shift register 151, an exclusive OR gate 155 having two inputs respectively connected to the output <3> of shift register 151 and the output of NOR gate 153, and an exclusive OR gate 157 having a pair of inputs respectively connected to the output of exclusive OR gate 155 and the first stage output <0> of shift register 151. The output of exclusive OR gate 157 is applied as an input to stage <0> of shift register 151. The clock signal CLK is applied to shift register 151. The shift register 151 can initially be seeded with all zeroes "0" at stages <0><1><2><3> and it will generate the repeating 16 bit pattern "1111010110010000." In lieu of generating the repeating bit pattern with a circuit, the pattern can also be stored in the memory controller 13 (FIG. 1) and the next state generator 107 (FIG. 8) and repeatedly read out during calibration.

Although the invention has been described with reference to an M-bit sequence where M=4 for predicting the next four-bit sequence, this is only one example of how the invention may be implemented. The invention may be used with any number of bits less than the $2^N$ bits of the repeating synchronization pattern, with even numbered bit sequences being preferred.

The calibration of one data path as described above can also be performed with in phase and out of phase cross talk components applied to adjacent data pins and/or data paths. In this manner, calibration can be obtained under conditions which more closely replicate conditions of actual use. Thus, for example, when a particular data path, e.g., FLAG, is being calibrated as described with reference to FIG. 8, the same pattern can be applied to adjacent data pins and/or paths, e.g., an adjacent path of the CA0-9 bus, in phase and/or out of phase.

It is also possible to calibrate several data paths simultaneously using the techniques described above with the remaining data paths not under calibration using in phase and/or out of phase calibration signals. For example, half of the data paths can be designated as "victims" and undergo simultaneous calibration using the technique described above with reference to FIGS. 4–8, while the remaining half of the data paths can be designated as noise sources. Calibration would simultaneously occur on the "victim" data paths while the noise source data paths receive alternating in phase and out of phase calibration signals. After calibration of the "victims," the "victim" and "noise source" pins and/or data paths would then be reversed and calibration now carried out on the new "victims" using the other data paths as noise sources as described above.

Figure 9:
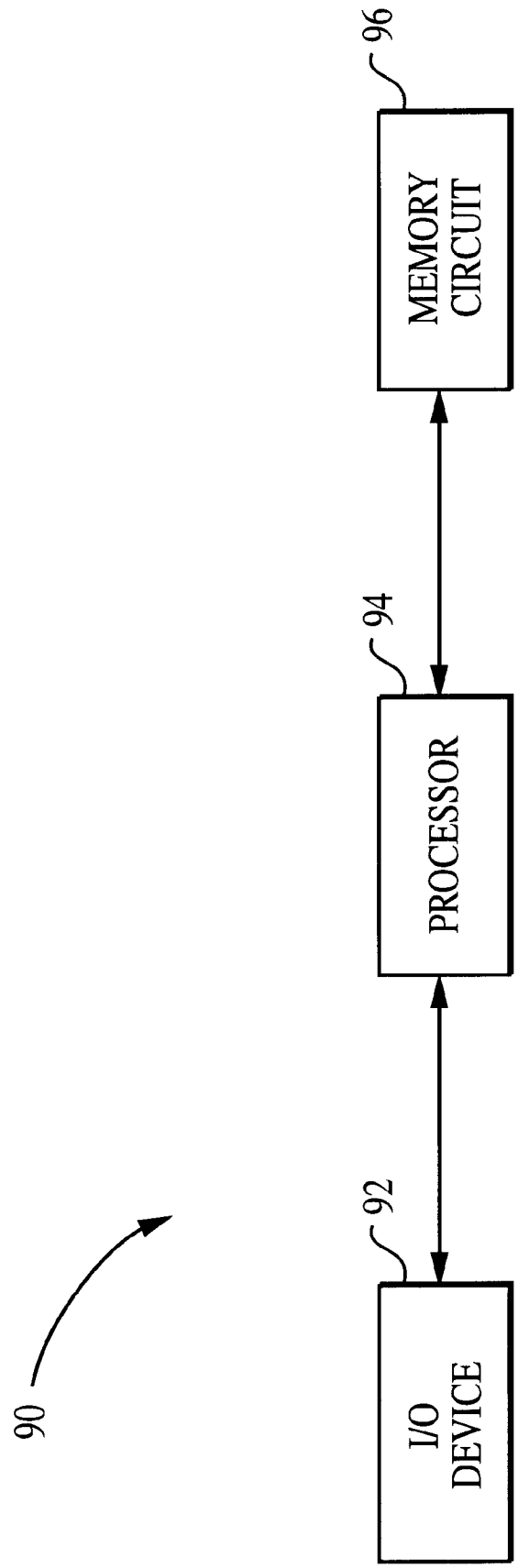
FIG. 9 illustrates a processor based system using an SLDRAM memory which employs calibration structures and process methodologies in accordance with the invention.

A memory device containing the calibration structure and operating as described above may be used in a processor-based system of the type shown in FIG. 9. The processor-based system 90 comprises a processor 94, a memory circuit 96, and an I/O (input/output) device 92. The memory circuit 96 may be an SLDRAM memory circuit or any other type of memory circuit containing the calibration structure operating as described in accordance with the present invention. In addition, the processor 94 may itself be an integrated processor which utilizes on chip memory devices containing the calibration structure of the present invention. Furthermore, memory controller 13 (FIG. 1) may be separate from the processor 94, or may be integrated with the processor 94, along with other elements of the memory circuit 96 described above in accordance with the invention, or the processor 94 itself may function as the memory controller 13.

In the preceding discussion, the apparatus and method of the invention has been described with regard to a memory device which clocks data (i.e., reads or writes data) twice per clock cycle: on both the rising and falling edges of the clock. However, the present invention may be used in any memory device in which calibration is performed, including devices which clock data once per clock cycle, for example on one of either the rising or falling edge of the clock.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A method of calibrating a data path of a digital circuit comprising:
   a) receiving on said data path a first m-bit data sequence which forms part of a larger bit calibration pattern;
   b) examining said received first m-bit data sequence and predicting therefrom a second m-bit data sequence which follows said first m-bit data sequence in said calibration pattern;
   c) receiving on said data path a third m-bit data sequence which forms part of said calibration pattern; and
   d) comparing said received third m-bit data sequence with said predicted second m-bit data sequence and indicating whether there is coincidence of data between said second and third m-bit data sequences.

2. A method as in claim 1 further comprising:
setting a predetermined delay in said data path prior to receiving said first m-bit sequence and changing a value of said delay if said comparing step indicates that there is no coincidence of data of said second and third sequences.

3. A method as in claim 2 further comprising:
examining said third m-bit data sequence, and
predicting a fourth m-bit data sequence which follows said third m-bit data
sequence in said calibration pattern from said third m-bit data sequence;
receiving on said data path a fifth m-bit data sequence; and
comparing said received fifth m-bit data sequence with said predicted fourth m-bit data sequence and indicating whether there is coincidence of data between said fourth and fifth m-bit data sequences.

4. A method as in claim 3 further comprising again changing a value of said delay if said comparing step indicates that there is no coincidence of data between said fourth and fifth m-bit data sequences.

5. A method as in claim 3 further comprising indicating that calibration has been achieved if said comparing step indicates coincidence of data between said fourth and fifth m-bit data sequences.

6. A method as in claim 3 further comprising repeating said steps of examining, predicting, receiving and comparing several times for successive m-bit data sequences of said data path, and indicating that calibration has been achieved if said comparing step indicates coincidence of data each time.

7. A method as in claim 1 further comprising indicating that calibration has been achieved if said comparing step indicates coincidence of data between said second and third m-bit data sequences.

8. A method as in claim 1 wherein said first and second data sequences are successive m-bit data sequences of a $2^N$ bit calibration pattern.

9. A method as in claim 8 wherein said $2^N$ bit calibration pattern is a 16 bit calibration pattern.

10. A method as in claim 8 wherein data bits of said calibration pattern are aligned with the edges of a clock signal, and
wherein said step of receiving said first m-bit data sequence includes sequentially latching the data bits of said m-bit data sequence on said data path with said clock signal, and sequentially loading the latched data bits of said first m-bit data sequence into a register where said data bits are examined in said examining step.

11. A method as in claim 10, wherein said examining step further comprises generating an incorrect prediction of said second m-bit data sequence when predetermined data patterns exist in said first m-bit data sequence.

12. A method as in claim 11 wherein said predetermined data patterns are those associated with a predetermined edge of said clock signal.

13. A method as in claim 12 wherein said predetermined edge is a negative going edge of said clock signal.

14. A method as in claim 12 wherein said predetermined edge is a positive going edge of said clock signal.

15. A method as in claim 8 wherein each said m-bit data sequence contains an even number of data bits.

16. A method as in claim 15 wherein said even number of data bits is four.

17. A method as in claim 1 wherein said digital circuit is included in a memory device.

18. A method as in claim 1 wherein said digital circuit is included in a memory controller.

19. A method of calibrating a data path which contains an adjustable delay element therein, and a data latch for latching data passing through said adjustable delay element using a clock signal, said method comprising:
a) setting a delay value for said delay element;
b) latching a first m-bit data sequence on said data path with said data latch using said clock signal;
c) storing said first m-bit data sequence;
d) examining said stored first m-bit data sequence and predicting therefrom a second m-bit data sequence which follows said first m-bit data sequence on said data path;
e) latching a third m-bit data sequence on said data path with said data latch using said clock signal; and
f) comparing said third m-bit data sequence with said second m-bit data sequence for coincidence of data.

20. A method as in claim 19, further comprising:
g) repeating several times said steps of latching, storing and examining a first m-bit data sequence on said data path, predicting a second m-bit data sequence, latching a third m-bit data sequence and comparing said third m-bit data sequence with said second m-bit data sequence for coincidence of data.

21. A method as in claim 20, further comprising:
h) indicating that calibration has been achieved if said comparing step indicates coincidence of data each of said several times.

22. A method as in claim 19, further comprising:
g) if there is no coincidence in step (f), setting a new delay value for said delay element and repeating steps (b) through (g) at least until said comparing step indicates coincidence in said second and third m-bit data sequences.

23. A method as in claim 19 further comprising:
g) setting a new delay value for said delay element and repeating steps (b) through (g) for all possible delay values of said delay element and storing an indication of those delay values which produce coincidence of said second and third m-bit data sequences in said comparing step.

24. A method as in claim 23 further comprising:
after steps (b) through (g) are repeated for all possible delay values of said delay element, setting as a final delay value a delay for said delay element which is within a range of those stored delay values which produce coincidence of said second and third m-bit sequences.

25. A method as in claim 24 wherein said final delay value is set at a delay value which is at or near the center of said range.

26. A method as in claim 19 wherein said first and second data sequences are successive m-bit data sequences of a $2^N$ bit calibration pattern.

27. A method as in claim 26 wherein said $2^N$ bit calibration pattern is a 16 bit calibration pattern.

28. A method as in claim 26 wherein data bits of said calibration pattern are aligned with the edges of said clock signal.

29. A method as in claim 28 wherein said examining step further comprises generating an incorrect prediction of said second m-bit data sequence when predetermined data patterns exist in said first m-bit data sequence.

30. A method as in claim 29 wherein said predetermined data patterns are those associated with a predetermined edge of said clock signal.

31. A method as in claim 30 wherein said predetermined edge is a negative going edge of said clock signal.

32. A method as in claim 30 wherein said predetermined edge is a positive going edge of said clock signal.

33. A method as in claim 26 wherein each said m-bit data sequence contains an even number of data bits.

34. A method as in claim 33 wherein said even number of data bits is four.

35. A method as in claim 19 wherein said data path is included in a memory device.

36. A method as in claim 19 wherein said data path is included in a memory controller.

37. An apparatus for calibrating a data path of a digital circuit comprising:
   a register which stores a first m-bit data sequence arriving on said data path; a predictor circuit which predicts from said stored first m-bit data sequence a second m-bit data sequence which follows said first m-bit data sequence on said data path; and
   a comparison circuit that compares a third m-bit data sequence, which follows said first m-bit sequence on said data path, with said second m-bit sequence and that indicates whether said second m-bit sequence matches said third m-bit sequence.

38. An apparatus as in claim 37 wherein said digital circuit operates on a plurality of successive m-bit data sequences arriving on said data path and calibration is indicated if each said second m-bit sequence of said plurality matches each respective third m-bit sequence of said plurality.

39. An apparatus as in claim 37 further comprising an adjustable delay element in said data path set to a predetermined delay value.

40. An apparatus as in claim 39, wherein said delay element is subsequently set to a new delay value if said comparison circuit does not indicate a match between said second and third m-bit sequences.

41. An apparatus as in claim 39 further comprising a logic circuit connected to an output of said comparison circuit that sets a delay value of said delay element, said logic circuit setting a new delay value after receiving said output from said comparison circuit at least until said comparison circuit indicates a match between said second and third m-bit sequences.

42. An apparatus as in claim 39 further comprising a logic circuit connected to an output of said comparison circuit that sets a delay value of said delay element, receives an indication of whether said second and third m-bit sequences match, sets a new delay value of said delay element and repeats the setting of a new delay value and receiving said indication as it steps through all possible delay values of said delay element.

43. An apparatus as in claim 42 further comprising a storage unit that stores an indication of those delay values of said delay element for which a match is indicated by said comparison circuit.

44. An apparatus as in claim 43 wherein said logic circuit sets as a final delay value of said delay element a delay value which is within a range of those stored delay values for which a match is indicated by said comparison circuit.

45. An apparatus as in claim 44 wherein said logic circuit sets as said final delay value of said delay element a delay value which is at or near the center of said range.

46. An apparatus as in claim 37 wherein said first and second data sequences are successive m-bit data sequences of a $2^N$ bit calibration pattern.

47. An apparatus as in claim 46 wherein said $2^N$ bit calibration pattern is a 16 bit calibration pattern.

48. An apparatus as in claim 46 wherein data bits of said calibration pattern are aligned with edges of a clock signal and further comprising a data latch in said data path that latches data of said first m-bit sequence with said clock signal prior to said first m-bit sequence being stored in said register.

49. An apparatus as in claim 48 wherein said predictor circuit generates an incorrect prediction of said second m-bit data sequence when predetermined data patterns exist in said first m-bit data sequence.

50. An apparatus as in claim 49 wherein said predetermined data patterns are those associated with a predetermined edge of said clock signal.

51. An apparatus as in claim 50 wherein said predetermined edge is a negative going edge of said clock signal.

52. An apparatus as in claim 50 wherein said predetermined edge is a positive going edge of said clock signal.

53. An apparatus as in claim 46 wherein each said m-bit data sequence contains an even number of data bits.

54. An apparatus as in claim 53 wherein said even number of data bits is four.

55. An apparatus as in claim 37 wherein said digital circuit indicates calibration has been achieved if said comparison circuit indicates a match between said second and third m-bit sequences.

56. An apparatus as in claim 37 wherein said data path is included in a memory device.

57. An apparatus as in claim 37 wherein said data path is included in a memory controller.

58. An apparatus for calibrating a data path of a digital circuit comprising:
   an adjustable delay element in said data path;
   a data latch that latches data passing through said adjustable delay element using a clock signal;
   a register which stores a first m-bit data sequence arriving on said data path, data in said first data sequence being latched by said data latch;
   a predictor circuit which predicts from said stored first m-bit data sequence a second m-bit data sequence which follows said first m-bit data sequence on said data path; and
   a comparison circuit that compares a third m-bit data sequence, which follows said first m-bit sequence on said data path, with said second m-bit sequence and that indicates whether said second m-bit sequence matches said third m-bit sequence.

59. An apparatus as in claim 58 wherein said digital circuit operates on a plurality of successive m-bit data sequences arriving on said data path and calibration is indicated if each said second m-bit sequence of said plurality matches each respective third m-bit sequence of said plurality.

60. An apparatus as in claim 58 further comprising a logic circuit connected to an output of said comparison circuit that sets a delay value of said delay element, said logic circuit setting a new delay value after receiving said output from said comparison circuit at least until said comparison circuit indicates a match between said second and third m-bit sequences.

61. An apparatus as in claim 60 further comprising a storage unit that stores an indication of those delay values of said delay element for which a match is indicated by said comparison circuit.

62. An apparatus as in claim 61 wherein said logic circuit sets as a final delay value of said delay element a delay value which is within a range of those stored delay values for which a match is indicated by said comparison circuit.

63. An apparatus as in claim 62 wherein said logic circuit sets as said final delay value of said delay element a delay value which is at or near the center of said range.

64. An apparatus as in claim 58 further comprising a logic circuit connected to an output of said comparison circuit that sets a delay value of said delay element, receives an indication of whether said second and third m-bit sequences match, sets a new delay value of said delay element and repeats the setting of a new delay value and receiving said indication as it steps through all possible delay values of said delay element.

65. An apparatus as in claim 58 wherein said first and second data sequences are successive m-bit data sequences of a $2^N$ bit calibration pattern.

66. An apparatus as in claim 65 wherein said $2^N$ bit calibration pattern is a 16 bit calibration pattern.

67. An apparatus as in claim 58 wherein said predictor circuit generates an incorrect prediction of said second m-bit data sequence when predetermined data patterns exist in said first m-bit data sequence.

68. An apparatus as in claim 67 wherein said predetermined data patterns are those associated with a predetermined edge of said clock signal.

69. An apparatus as in claim 68 wherein said predetermined edge is a negative going edge of said clock signal.

70. An apparatus as in claim 68 wherein said predetermined edge is a positive going edge of said clock signal.

71. An apparatus as in claim 58 wherein each said m-bit data sequence contains an even number of data bits.

72. An apparatus as in claim 71 wherein said even number of data bits is four.

73. An apparatus as in claim 58 wherein said digital circuit indicates calibration has been achieved if said comparison circuit indicates a match between said second and third m-bit sequences.

74. An apparatus as in claim 58 wherein said data path is included in a memory device.

75. An apparatus as in claim 58 wherein said data path is included in a memory controller.

76. A processor-based system, comprising:
a processor;
a memory circuit connected to said processor, at least one of said processor and said memory circuit including a calibration circuit comprising:
a register which stores a first m-bit data sequence arriving on said data path; a predictor circuit which predicts from said stored first m-bit data sequence a second m-bit data sequence which follows said first m-bit data sequence on said data path; and
a comparison circuit that compares a third m-bit data sequence, which follows said first m-bit sequence on said data path, with said second m-bit sequence and that indicates whether said second m-bit sequence matches said third m-bit sequence.

77. An apparatus as in claim 76 wherein said calibration circuit operates on a plurality of successive m-bit data sequences arriving on said data path and calibration is indicated if each said second m-bit sequence of said plurality matches each respective third m-bit sequence of said plurality.

78. An apparatus as in claim 76 further comprising an adjustable delay element in said data path set to a predetermined delay value.

79. An apparatus as in claim 78, wherein said delay element is subsequently set to a new delay value if said comparison circuit does not indicate a match between said second and third m-bit sequences.

80. An apparatus as in claim 78 further comprising a logic circuit connected to an output of said comparison circuit that sets a delay value of said delay element, said logic circuit setting a new delay value after receiving said output from said comparison circuit at least until said comparison circuit indicates a match between said second and third m-bit sequences.

81. An apparatus as in claim 78 further comprising a logic circuit connected to an output of said comparison circuit that sets a delay value of said delay element, receives an indication of whether said second and third m-bit sequences match, sets a new delay value of said delay element and repeats the setting of a new delay value and receiving said indication as it steps through all possible delay values of said delay element.

82. An apparatus as in claim 81 further comprising a storage unit that stores an indication of those delay values of said delay element for which a match is indicated by said comparison circuit.

83. An apparatus as in claim 82 wherein said logic circuit sets as a final delay value of said delay element a delay value which is within a range of those stored delay values for which a match is indicated by said comparison circuit.

84. An apparatus as in claim 83 wherein said logic circuit sets as said final delay value of said delay element a delay value which is at or near the center of said range.

85. An apparatus as in claim 76 wherein said first and second data sequences are successive m-bit data sequences of a $2^N$ bit calibration pattern.

86. An apparatus as in claim 85 wherein said $2^N$ bit calibration pattern is a 16 bit calibration pattern.

87. An apparatus as in claim 86 wherein each said m-bit data sequence contains an even number of data bits.

88. An apparatus as in claim 87 wherein said even number of data bits is four.

89. An apparatus as in claim 85 wherein data bits of said calibration pattern are aligned with edges of a clock signal and further comprising a data latch in said data path that latches data of said first m-bit sequence with said clock signal prior to said first m-bit sequence being stored in said register.

90. An apparatus as in claim 76 wherein said predictor circuit generates an incorrect prediction of said second m-bit data sequence when predetermined data patterns exist in said first m-bit data sequence.

91. An apparatus as in claim 90 wherein said predetermined data patterns are those associated with a predetermined edge of said clock signal.

92. An apparatus as in claim 91 wherein said predetermined edge is a negative going edge of said clock signal.

93. An apparatus as in claim 91 wherein said predetermined edge is a positive going edge of said clock signal.

94. An apparatus as in claim 76 wherein said digital circuit indicates calibration has been achieved if said comparison circuit indicates a match between said second and third m-bit sequences.

95. An apparatus as in claim 76 wherein said calibration circuit is included in a memory device.

96. An apparatus as in claim 76 wherein said calibration circuit is included in a memory controller.

97. An embedded-memory processor-based system, comprising:
a processor;
a memory circuit formed on a same integrated circuit as said processor, said memory circuit including a calibration circuit comprising:

a register which stores a first m-bit data sequence arriving on said data path;

a predictor circuit which predicts from said stored first m-bit data sequence a second m-bit data sequence which follows said first m-bit data sequence on said data path; and a comparison circuit that compares a third m-bit data sequence, which follows said first m-bit sequence on said data path, with said second m-bit sequence and that indicates whether said second m-bit sequence matches said third m-bit sequence.

98. An apparatus as in claim 97 wherein said calibration circuit operates on a plurality of successive m-bit data sequences arriving on said data path and calibration is indicated if each said second m-bit sequence of said plurality matches each respective third m-bit sequence of said plurality.

99. An apparatus as in claim 97 further comprising an adjustable delay element in said data path set to a predetermined delay value.

100. An apparatus as in claim 99, wherein said delay element is subsequently set to a new delay value if said comparison circuit does not indicate a match between said second and third m-bit sequences.

101. An apparatus as in claim 99 further comprising a logic circuit connected to an output of said comparison circuit that sets a delay value of said delay element, said logic circuit setting a new delay value after receiving said output from said comparison circuit at least until said comparison circuit indicates a match between said second and third m-bit sequences.

102. An apparatus as in claim 99 further comprising a logic circuit connected to an output of said comparison circuit that sets a delay value of said delay element, receives an indication of whether said second and third m-bit sequences match, sets a new delay value of said delay element and repeats the setting of a new delay value and receiving said indication as it steps through all possible delay values of said delay element.

103. An apparatus as in claim 102 further comprising a storage unit that stores an indication of those delay values of said delay element for which a match is indicated by said comparison circuit.

104. An apparatus as in claim 103 wherein said logic circuit sets as a final delay value of said delay element a delay value which is within a range of those stored delay values for which a match is indicated by said comparison circuit.

105. An apparatus as in claim 104 wherein said logic circuit sets as said final delay value of said delay element a delay value which is at or near the center of said range.

106. An apparatus as in claim 97 wherein said first and second data sequences are successive m-bit data sequences of a $2^N$ bit calibration pattern.

107. An apparatus as in claim 106 wherein said $2^N$ bit calibration pattern is a 16 bit calibration pattern.

108. An apparatus as in claim 106 wherein data bits of said calibration pattern are aligned with edges of a clock signal and further comprising a data latch in said data path that latches data of said first m-bit sequence with said clock signal prior to said first m-bit sequence being stored in said register.

109. An apparatus as in claim 106 wherein each said m-bit data sequence contains an even number of data bits.

110. An apparatus as in claim 109 wherein said even number of data bits is four.

111. An apparatus as in claim 97 wherein said predictor circuit generates an incorrect prediction of said second m-bit data sequence when predetermined data patterns exist in said first m-bit data sequence.

112. An apparatus as in claim 111 wherein said predetermined data patterns are those associated with a predetermined edge of said clock signal.

113. An apparatus as in claim 112 wherein said predetermined edge is a negative going edge of said clock signal.

114. An apparatus as in claim 112 wherein said predetermined edge is a positive going edge of said clock signal.

115. An apparatus as in claim 97 wherein said digital circuit indicates calibration has been achieved if said comparison circuit indicates a match between said second and third m-bit sequences.

116. An apparatus as in claim 97 wherein said calibration circuit is included in a memory device.

117. An apparatus as in claim 97 wherein said calibration circuit is included in a memory controller.

* * * * *